United States Patent [19]
Maue et al.

[11] Patent Number: 5,211,586
[45] Date of Patent: May 18, 1993

[54] POWER STRIP

[75] Inventors: Hans-Heinrich Maue, Bietigheim-Bissingen; Uwe Schaub, Vaihingen/Enz; Hannes Kalhammer, Beilstein, all of Fed. Rep. of Germany

[73] Assignee: Robert Bosch GmbH, Stuttgart, Fed. Rep. of Germany

[21] Appl. No.: 687,907

[22] PCT Filed: Nov. 20, 1990

[86] PCT No.: PCT/DE90/00895
§ 371 Date: Jun. 5, 1991
§ 102(e) Date: Jun. 5, 1991

[87] PCT Pub. No.: WO91/11041
PCT Pub. Date: Jul. 25, 1991

[30] Foreign Application Priority Data
Jan. 10, 1990 [DE] Fed. Rep. of Germany ....... 4000548

[51] Int. Cl.[5] .......................................... H01R 13/502
[52] U.S. Cl. ..................................... 439/695; 439/752
[58] Field of Search ............... 439/752, 733, 686, 695, 439/701

[56] References Cited

U.S. PATENT DOCUMENTS

| 4,319,799 | 3/1982 | Pearce, Jr. | 439/752 |
| 4,596,436 | 6/1986 | Kraemer et al. | 439/686 |
| 4,723,196 | 2/1988 | Hofmeister et al. | 439/76 |
| 4,776,651 | 10/1988 | Paulo | 439/885 |

FOREIGN PATENT DOCUMENTS 3330151 3/1985 Fed. Rep. of Germany ...... 439/752

Primary Examiner—Gary F. Paumen
Attorney, Agent, or Firm—Edwin E. Greigg; Ronald E. Greigg

[57] ABSTRACT

A power strip for electrical switch devices which includes a plurality of plug connection parts disposed in a base body in a sealed-off manner, and is joined with the aid of contacts to conductor tracks of a first printed wiring board. The conductor tracks of a second printed wiring board are linked with further plug connection parts. To enable opening at will, the plug connection parts are disposed in an insert part that can be introduced into a recess of the base plate. The insert part is fixed in the base body with the aid of a comb-like part. The embodiment of the tines of the comb-like locking part enables simple assembly and disassembly.

25 Claims, 3 Drawing Sheets

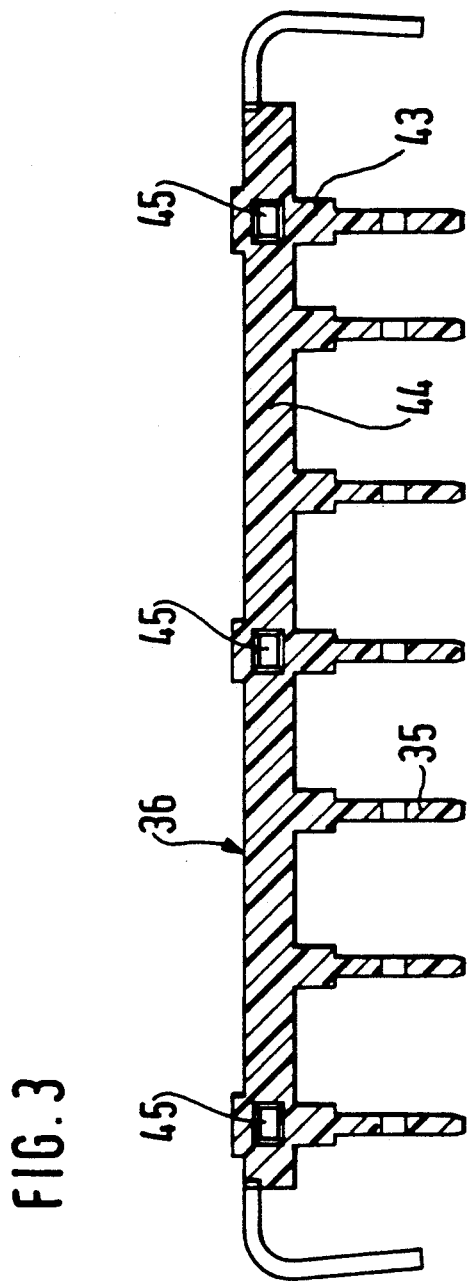

POWER STRIP

BACKGROUND OF THE INVENTION

The invention is based on a power strip, in particular for an electric switch device. A known power strip is embodied in divided form, with a plurality of plug connection parts disposed fixedly in the power strip and with further plug connecting parts located in an insert part. The insert part snaps into place with the aid of prongs into a bore of the housing of the power strip. However, this power strip has the disadvantage of not providing adequate sealing in the direction of the counterpart. The plug connection parts cannot be removed without destroying them, so it is impossible to make repairs once an electric switch device has been installed.

ADVANTAGES OF THE INVENTION

The power strip according to the invention as defined has the advantage over the prior art that adequately good sealing with respect to the installed switch device can be attained by sealing the base body of the power strip. Thus the conditions that users of the power strip require are adequately met. The pressing force necessary to effect the sealing is brought to bear in a simple manner by the arresting comb. Simple and economical assembly is possible. With the aid of the wedge-shaped region of the tines of the arresting comb, the necessary pressing force on the seal can be generated with little exertion of force. The remainder of the region of the tines of the comb, in operative connection with its contact faces of the base body, effects centering and fixation. Because the comb is asymmetrically embodied, more secure installation is possible. The comb can be pulled out again at any time in a simple manner, to enable repairs on the installed control unit. The shoulders of the tines keep the insert part in a defined position.

Advantageous further developments of the power strip disposed in the main claim are possible with the characteristics recited in the dependent claims.

BRIEF DESCRIPTION OF THE DRAWING

An exemplary embodiment of the invention is shown in the drawing and described in further detail below. FIG. 3 shows a detail in longitudinal section.

DESCRIPTION OF THE EXEMPLARY EMBODIMENT

Figure 1:
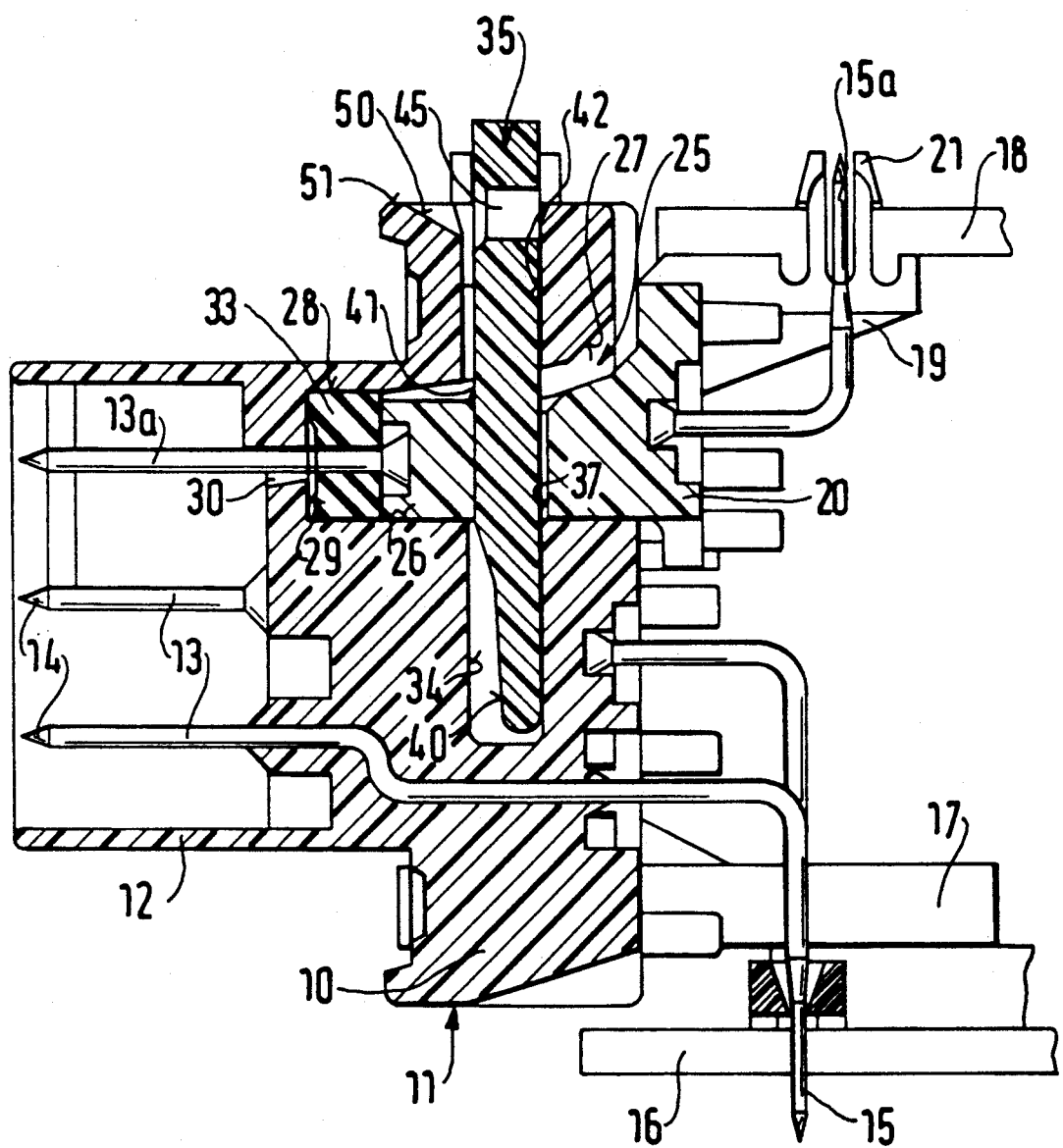
FIG. 1 shows a longitudinal section through a power strip.
Figure 2:
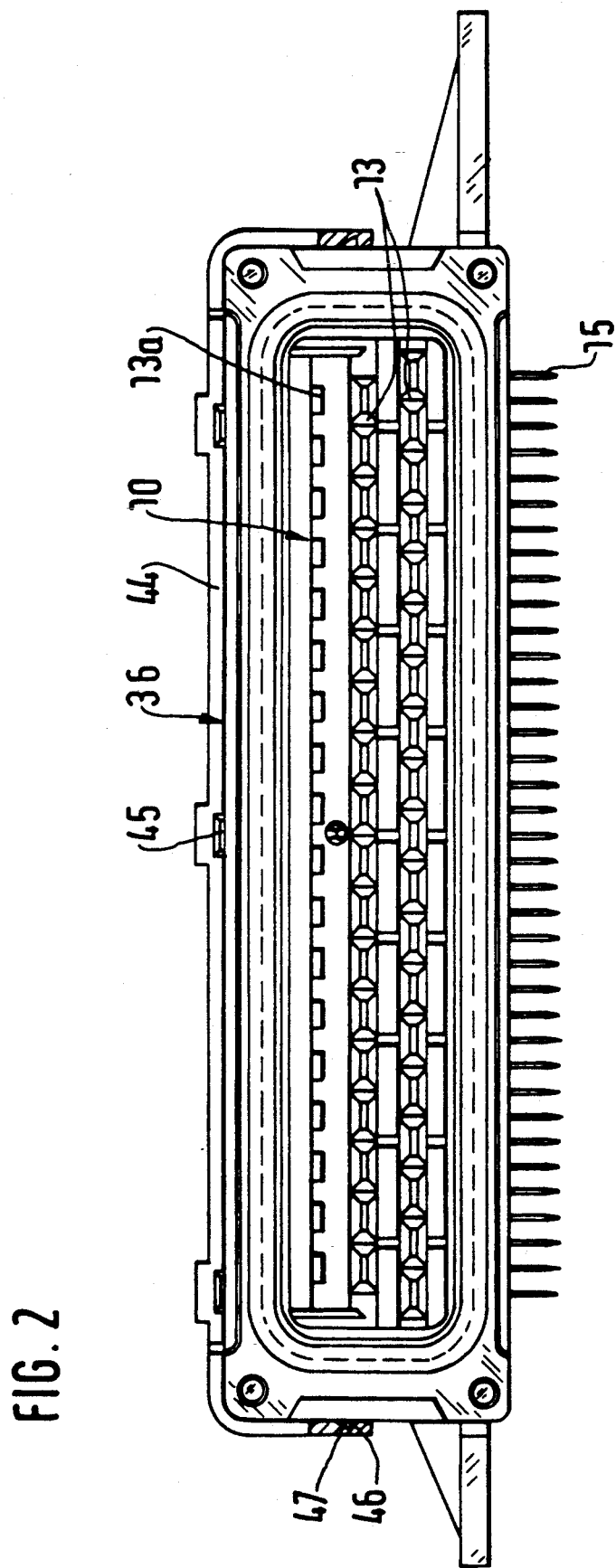
FIG. 2 is a view in the direction A of FIG. 1.

In FIG. 1, 10 designates a base body, made from plastic, of a power strip 11, which has a holder body 12 on its front for holding a counterpart plug, not shown. A number of flat plugs 13 are embedded in the base body 10 in a sealed manner. The flat plugs 13, arranged in two rows, protrude with their plug portions 14 into the holder body 12 for the counterpart plug. The other end of the flat plug 13 is embodied as a connection lug 15 and is soldered to an associated conductor track, not shown in detail, of a first printing wiring board 16. Instead of a printed wiring board, a hybrid board may be used.

Virtually parallel to the first printing wiring board 16, a second printing board 18 is secured to one branch 19 of an insert part 20 with the aid of a snap connection 21. Other flat plugs 13a are embedded in the insert part 20 in a sealed manner. One end of each flat plug 13a is again embodied as a connection lug 15a, and these lugs are soldered to conductor tracks on the second printing wiring board 18.

A recess 25 is formed in the base body 10 from the direction of the switch device; its side 26 toward the first printing wiring board 16 is vertical and preferably parallel to the first printing wiring board 16. The opposite side of the recess 26 has a beveled face 27, for introduction of the insert part 20, and an end region 28 that extends parallel to the other side 26. There is also a number of windows 30 corresponding to the number of flat plugs 13a in the bottom 29 of the recess 25. A seal 33 is disposed between the insert part 20 and the bottom part 29 of the recess 25. The bottom 29 of the recess 25 and the face end of the insert part 20 toward the seal 33 are shaped specifically for the seal. This provides good contact of the seal 33 or in other words a line-type contact of the seal 33. Vertically of the recess 25 in other words vertically of the side 26, blind bores 34 are formed in the base body 10, intersecting the recess 25. The tines 35 of the comb 36 are introduced into the blind bores 34. The number of tines 35 and blind bores 34 should be the same. The spacing between the various tines 35 must correspond to that between the various blind bores 34. The spacing between two tines 35 differs from the remaining spacing, resulting in an asymmetrical shape of the comb 36. In the insert part 20, a number of openings 37 corresponding to the number of tines 35 is also formed, and when the tines 35 are inserted these openings should be coaxial with the blind bores 34.

The end region of the tines 35 is wedge-shaped, on the side toward the bottom 29 of the recess 25. In FIG. 1, this region 40 is shown as a two-staged portion. A constant course, or some other multi-stage course is also possible. This side of the tines 35 extends parallel to the back side 42 in the remaining region 41. Shoulders 43, preferably of rectangular cross section, are disposed on the tines 35 in an area offset by 90° from the wedge-shaped region 40, in other words at right angles to the plane of the drawing in FIG. 1. The shoulders 43 extend as far as the connecting strap 44 of the comb 36, in which there are rectangular disassembly holes 45. Recesses 46 are present in the applicable resilient ends of the connecting strap 44, and protrusions 47 disposed on the base body 10 can snap into place in these recesses. Recesses 50 having an oblique face, producing a shoulder 51, are disposed in the region of the disassembly holes 45 in the base body 10 of the power strip 11.

A detachable flat plug 13a for the power strip 11 is necessary, for instance to make it simple to equip the two printing wiring boards 16, 18 with electrical or electronic components on the sides of these boards facing one another. After the boards are equipped with the components, the branch 19 of the insert part 20 is secured to the second printed wiring board 18, with the aid of the snap connection 21. Next, the components and the connection lugs 15 and 15a are soldered to the printed wiring boards 16, 18. The seal 33 is slipped onto the flat plugs 13a, until it rests on the insert part 20. To mount the flat plugs 13a on the power strip so that they cannot fall out, the bores of the seal 33 are embodied as slightly smaller that the cross section of the flat plug 13a. Also, the seal 33 extends over the entire length of the insert part 20. The insert part 20 is now introduced into the recess 25. As soon as the flat plug 13a protrudes into the window 30, the insert part 20 slides along the oblique introduction face 27 of the recess 25, until the seal 33 rests on the bottom 29 of the recess 25. The insert part 20 is temporarily held in this position with an additional device, or in manual assembly is held by hand without exerting pressure.

The comb 36 is now introduced with its tines 35 into the blind bores 34. Because of the multi-stage, wedge-shaped form of the region 40, the tines 35 can be passed through the openings 37 of the insert part 20 without exerting any force whatever on the insert part 20. Only once the tines 35 have been passed far enough through the openings 37 that the back side 42 of the tines 35 again comes to rest on the wall of the blind bore 34 does the wedge action of the region 40 begin. As the introduction of the tines 35 continues, the insert part 20 is moved toward the bottom 29 of the recess 25 by the wedge shape of the region 40, and the seal 33 is pressed on the bottom 29. As soon as the parallel region 41 has been introduced into the openings 37, the desired terminal position of the insert part 20 is attained. For a secure terminal position, the tines 35 are introduced far enough that the stops 43 of the tines 35 rest on the insert part 20. At the same time, the protrusions 47 of the base body 10 also snap into place in this position in the recesses 46 of the connecting strap 44. As a result, the comb 36 is joined to the base body 10 by a form-fitting connection in such a way that it cannot fall out.

To provide access to the assembly sides of the two printed wiring boards 16, 18, the comb 36 and thus the insert part 20 must be removable. To this end, the strap 44 is spread open in the region of the protrusions 47. Next, with a tool, all three disassembly holes 45 of the comb 36 are engaged. Placing the tool against the shoulder 51 and pivoting it creates a contrary bearing and lever action. Thus in the initial extraction phase, the comb 36 and thus the tines 35 can be raised in the blind bores 34 without exerting very much force. As soon as the lever action across the shoulder 51 is ended, the tool is used as an extracting tool. This is possible because the clamping force between the tines 35 and the insert part 20 decreases because of the wedge-shaped region of the tines 35. The insert part 20 can now be removed from the recess 25. Assembly and disassembly can be repeated as often as desired.

The foregoing relates to preferred exemplary embodiments of the invention, it being understood that other variants and embodiments thereof are possible within the spirit and scope of the invention, the latter being defined by the appended claims.

We claim:

1. A power strip (11) for an electrical switch device, having a base body (10), a plurality of first plug connection parts (13), which are supported in a sealed manner in the base body and which extend from the base body (10) and are joined to electrical components, a plurality of second plug connection parts (13a), which are disposed in an insert part 20) that is introduced into the base body (10), the insert part (20) is secured in the base body (10) with the aid of a comb-like locking part (36) which includes connecting straps (44) with tines (35) extending therefrom, the base body (10) is sealed off from the insert part (20) with the aid of a sealing means (33), and the tines (35) of the locking part (36) have a wedge-shaped region (40) that extends into the base body (10), said wedge-shaped region is oriented toward the sealing means (33), and said tines include a region (41) having a face parallel to a back side of said tines.

2. A power strip as defined by claim 1, in which the wedge-shaped region (40) of the tines (35) comprises a plurality of portions having different wedge angles.

3. A power strip as defined by claim 1, in which the parallel region (41) of the tines (35) has at least one shoulder (43), which is offset by 90° with respect to the wedge-shaped region (40) and said shoulder has a larger cross section than openings (37), which are embodied in the insert part (20) and into which the tines (35) are inserted.

4. A power strip as defined by claim 2, in which the parallel region (41) of the tines (35) having parallel faces has at least one shoulder (43), which is offset by 90° with respect to the wedge-shaped region (40) and said shoulder has a larger cross section than openings (37), which are embodied in the insert part (20) and into which the tines (35) are inserted.

5. A power strip as defined by claim 1, in which a spacing between the tines (35) of the locking part (36) varies.

6. A power strip as defined by claim 2, in which a spacing between the tines (35) of the locking part (36) varies.

7. A power strip as defined by claim 3, in which a spacing between the tines (35) of the locking part (36) varies.

8. A power strip as defined by claim 1, in which a disposition of the tines (35) of the locking part (36) is asymmetrical.

9. A power strip as defined by claim 2, in which a disposition of the tines (35) of the locking part (36) is asymmetrical.

10. A power strip as defined by claim 3, in which a disposition of the tines (35) of the locking part (36) is asymmetrical.

11. A power strip as defined by claim 5, in which a disposition of the tines (35) of the locking part (36) is asymmetrical.

12. A power strip as defined by claim 1, in which the locking part has a plurality of disassembly holes (45) in the strap (44) connecting the tines (35).

13. A power strip as defined by claim 2, in which the locking part has a plurality of disassembly holes (45) in the strap (44).

14. A power strip as defined by claim 3, in which the locking part has a plurality of disassembly holes (45) in the strap (44).

15. A power strip as defined by claim 5, in which the locking part has a plurality of disassembly holes (45) in the strap (44).

16. A power strip as defined by claim 8, in which the locking part has a plurality of disassembly holes (45) in the strap (44).

17. A power strip as defined by claim 1, in which the locking part (36) is secured on the base body (10) with the aid of a form-fitting connection.

18. A power strip as defined by claim 2, in which the locking part (36) is secured on the base body (10) with the aid of a form-fitting connection.

19. A power strip as defined by claim 3, in which the locking part (36) is secured on the base body (10) with the aid of a form-fitting connection.

20. A power strip as defined by claim 5, in which the locking part (36) is secured on the base body (10) with the aid of a form-fitting connection.

21. A power strip as defined by claim 8, in which the locking part (36) is secured on the base body (10) with the aid of a form-fitting connection.

22. A power strip as defined by claim 12, in which the locking part (36) is secured on the base body (10) with the aid of a form-fitting connection.

23. A power strip as defined by claim 17, in which the form fitting connection comprises a protrusion (47) disposed on the base body (10), and a recess (46) in the strap (44).

24. A power strip as defined by claim 1 in which in a locked state of the locking part (36), shoulders (51) disposed in the base body (10) are located in a region of disassembly holes (45) of the locking part (36), so that a disassembly device engaging the disassembly holes (45) can be supported for removal of the locking part (36).

25. A power strip as defined by claim 2, in which in a locked state of the locking part (36), shoulders (51) disposed in the base body (10) are located in a region of disassembly holes (45) of the locking part (36), so that a disassembly device engaging the disassembly holes (45) can be supported for removal of the locking part (36).

* * * * *